United States Patent
Haberern et al.

[11] Patent Number: 5,882,988
[45] Date of Patent: Mar. 16, 1999

[54] SEMICONDUCTOR CHIP-MAKING WITHOUT SCRIBING

[75] Inventors: Kevin W. Haberern, Hopewell Junction, N.Y.; Rudolf P. Tijburg, Geldrop, Netherlands; Sharon J. Flamholtz, Fishkill, N.Y.

[73] Assignee: Philips Electronics North America Corporation

[21] Appl. No.: 950,604

[22] Filed: Oct. 16, 1997

Related U.S. Application Data

[63] Continuation of Ser. No. 515,666, Aug. 16, 1995.

[51] Int. Cl.$^6$ .................................................. H01L 21/301
[52] U.S. Cl. ..................................... 438/460; 438/462
[58] Field of Search ........................... 438/460, 462, 438/706, 754, 928; 148/DIG. 28

[56] References Cited

U.S. PATENT DOCUMENTS

| | | | |
|---|---|---|---|
| 3,897,627 | 8/1975 | Klatskin | 29/578 |
| 4,096,619 | 6/1978 | Cook, Jr. | 29/413 |
| 4,236,296 | 12/1980 | Woolhouse et al. | 437/226 |
| 4,237,601 | 12/1980 | Woolhouse et al. | 437/226 |
| 4,610,079 | 9/1986 | Abe et al. | 29/583 |
| 4,758,532 | 7/1988 | Yagi et al. | 437/226 |
| 4,804,641 | 2/1989 | Arlt et al. | 437/227 |
| 4,904,617 | 2/1990 | Muschke | 437/226 |
| 4,929,300 | 5/1990 | Wegleiter | 437/226 |
| 5,017,512 | 5/1991 | Takagi | 437/227 |
| 5,024,970 | 6/1991 | Mori | 437/226 |
| 5,196,378 | 3/1993 | Bean et al. | 437/226 |
| 5,198,069 | 3/1993 | Zimmermann et al. | 437/226 |
| 5,206,181 | 4/1993 | Gross | 437/8 |
| 5,212,394 | 5/1993 | Iwasaki et al. | 437/226 |
| 5,259,925 | 11/1993 | Herrick et al. | 437/226 |
| 5,284,792 | 2/1994 | Forster et al. | 437/226 |
| 5,363,395 | 11/1994 | Gaines et al. | 372/45 |
| 5,393,706 | 2/1995 | Mignardi et al. | 148/DIG. 28 |
| 5,399,885 | 3/1995 | Thijs et al. | 257/95 |
| 5,418,190 | 5/1995 | Cholewa et al. | 437/226 |

FOREIGN PATENT DOCUMENTS

| | | | |
|---|---|---|---|
| 53-46270 | 4/1978 | Japan . | |
| 5346270 | 4/1978 | Japan | H01L 21/302 |
| 5527684A | 2/1980 | Japan | H01L 21/78 |
| 5599742A | 7/1980 | Japan | H01L 21/78 |
| 56103447A | 8/1981 | Japan | H01L 21/78 |
| 59-21040 | 2/1984 | Japan | 437/226 |
| 2162750A | 6/1990 | Japan | H01L 21/78 |
| 3274750A | 12/1991 | Japan | H01L 21/78 |
| 5315703A | 11/1993 | Japan | H01S 3/18 |
| 6-125001 | 5/1994 | Japan | 437/226 |
| 07045560A | 2/1995 | Japan | H01L 21/301 |

*Primary Examiner*—R. Bruce Breneman
*Assistant Examiner*—Anita Alanko
*Attorney, Agent, or Firm*—Brian J. Wieghaus

[57] ABSTRACT

A method for fracturing semiconductor crystal wafers or bars to form individual chips with active devices without the use of mechanical scribing of the crystal. The method involves forming where fracture is desired a shallow trench by etching in the semiconductor wafer or bar, preferably with sharp corners, or providing over where the fracture is desired the edges of a metallization layer, or both. Applying pressure will then cause the crystal to fracture as a result of strains formed in the crystal at the sharp corners or below the metallization edges. The method is particularly suitable for the fabrication of laser chips from compound semiconductors.

6 Claims, 2 Drawing Sheets

SEMICONDUCTOR CHIP-MAKING WITHOUT SCRIBING

This is a continuation of application Ser. No. 08/515,666, filed Aug. 16, 1995.

This invention relates to making individual chips of semiconductor devices from a wafer or bar containing many semiconductor devices.

BACKGROUND OF THE INVENTION

In the semiconductor manufacturing process, after a wafer has been processed in the usual way with growth of epitaxial layers, diffusions of dopants and other species, and formation of insulating layers, followed by metallizations that are patterned to form the desired connections to each of the active devices formed in the wafer, individual chips of one or more active devices have to be separated from the wafer or bar. One standard technique for doing this is to scribe the wafer surface with a diamond scribe and then fracture the wafer along the scribe lines by applying pressure from the back side of the wafer. Another common technique is to use a chip chopping apparatus. Both of these techniques depend upon mechanically removing material from the semiconductor crystal, which requires that the removing tool must penetrate the layers on the wafer surface before reaching the underlying crystal. There are several problems that may arise as a result. Scribing is time-consuming. Moreover, when the surface of the device is scratched, the integrity of the metallization may be compromised, which can lead to difficulties. Another problem is that scratches may cause in the semiconductor crystal dislocations which may propagate to active device regions with undesirable consequences.

Further, for certain kinds of devices, such as II–V or II–VI laser devices made in chips separated from semiconductor bars, chip chopping does not work well, leaving only the scribing process with its attendant problems. Moreover, with the laser chips, the chip device is frequently mounted upside down on a heat sink. Any metallization defects produced by the scribing process can cause operational problems of the laser device.

SUMMARY OF THE INVENTION

An object of the invention is an improved method for separating semiconductor chips from semiconductor wafers or bars.

A further object of the invention is an improved method for separating semiconductor chips from semiconductor wafers or bars without use of chip chopping apparatus or scribing steps.

The invention is based on the concept of processing the semiconductor wafer or bar crystal, without mechanically removing material from the crystal as by scribing, to impart a strain field to the crystal at certain locations that causes the crystal when pressure is applied to cleave along desired lines into semiconductor chips.

According to one aspect of the invention, the strain field is provided by wet chemically or dry etching a shallow trench along the lines where cleavage is desired. In accordance with another aspect of the invention, the strain field is provided by forming a metallization layer having edges extending substantially above the lines where cleavage is desired. Preferably, the corners of the etched trenches and the corners formed by the metallization edges are sharp, as this serves as a focus for the applied pressure that is thereafter applied to cause the chip cleavage. Preferably, both a shallow trench and metallization edges are combined to enhance the strain field and make the separation more repeatable.

To fracture across the entire wafer or bar, which is usually desired, the trench or metallization edges should extend in a straight line parallel to a crystal plane substantially across the entire wafer or bar.

The various features of novelty which characterize the invention are pointed out with particularity in the claims annexed to and forming a part of this disclosure. For a better understanding of the invention, its operating advantages and specific objects attained by its use, reference should be had to the accompanying drawings and descriptive matter in which there are illustrated and described the preferred embodiments of the invention, like reference numerals identifying the same or similar elements.

DETAILED DESCRIPTION OF THE PREFERRED EMBODIMENTS

The invention is generally applicable to all semiconductor devices made from elemental semiconductors or compound semiconductors. However, the chip separation problem is especially acute in the manufacture of laser chips by separation from laser bars constituted of II–VI and III–V semiconductor materials. Such devices comprise a stack of II–VI layers epitaxially grown on, typically, a II–V compound substrate, such as GaAs. Reference is made to U.S. Pat. No. 5,363,395, whose contents are incorporated herein by reference, which describes one of a number of different schemes for fabricating laser devices in II–VI materials. Moreover, the invention is also applicable to laser chips fabricated in III–V semiconductor materials, typically also fabricated starting with a GaAs substrate, as described for example in U.S. Pat. No. 5,399,885, whose contents are also incorporated herein by reference. The invention is, however, not limited to wafers or bars built up from GaAs substrates but is also applicable to wafers or bars using other semiconductor compounds or elements.

Figure 1:
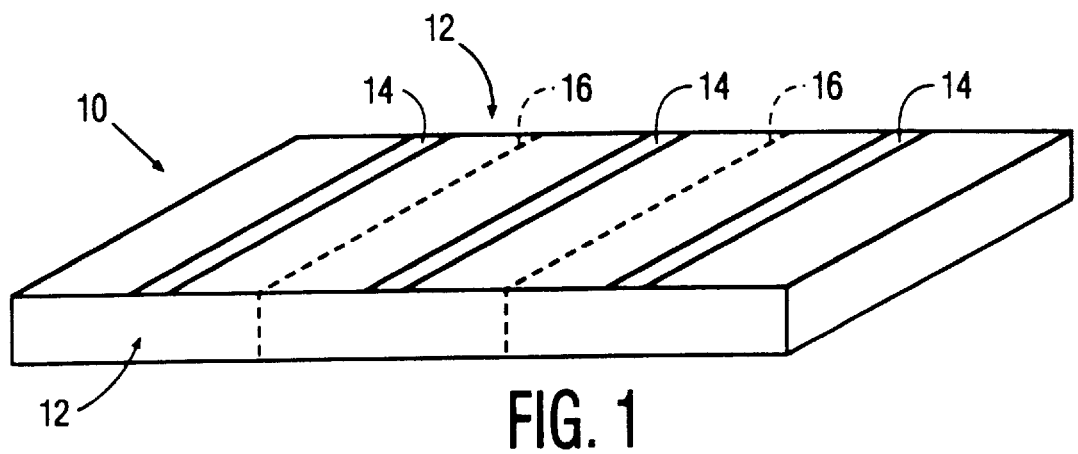
FIG. 1 is a perspective view of a semiconductor bar showing where cleavage is desired to form laser chips.

FIG. 1 shows a typical laser bar 10 made in a III–V crystal substrate, such as GaAs, on which layers of II–VI materials have been epitaxially deposited to create the structure necessary for lasing action. The manner in which the lasing structure was formed is not important to the invention, but it typically is done in a wafer from which bars are cleaved. As an example, one way of accomplishing it will be briefly described. The bar 10 is made by cleaving a wafer or slice along parallel crystal planes to form along the cleaved surfaces 12, mirrors of an optical lasing cavity. A typical slice is 10×8 mm, with a thickness of about 100 $\mu$m, which includes the substrate and the epitaxial layers, and a typical bar has a length of about 8 mm and a width of about 0.25–2.0 mm. A popular laser geometry has a stripe geometry to concentrate the current, represented schematically in FIG. 1 by the shaded areas 14. The mirrors 12 are perpendicular to the stripes 14.

Laser chips are made by dividing the bar 10 between the stripes 14 along its total width along the dashed lines 16 to form, in this instance, three individual laser chips, the number of which is not significant. The manner in which this is carried out is the basis of the invention.

In the normal fabrication of laser chips, an electrically isolating layer, e.g., of an oxide or nitride, is deposited on the surface, slits provided by a conventional photolithography process over the striped regions in the bar, and a layer of metallization provided over the surface, so that the metallization contacts the crystal surface only over the active striped regions 14. A typical metallization contact width is about 10–50 μm.

Figure 2:
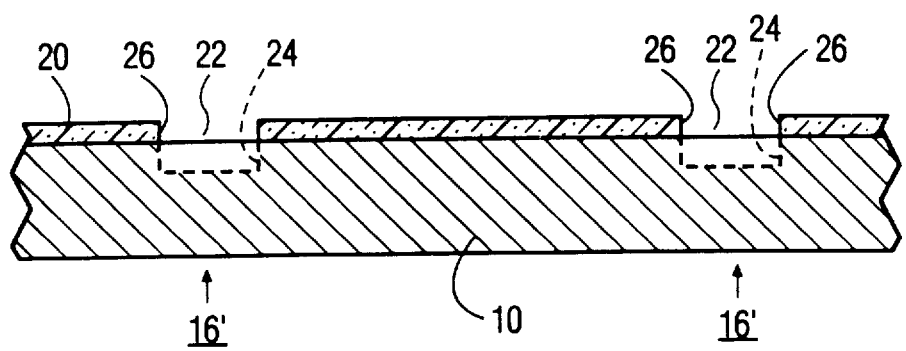
FIG. 2 is a cross-section through a semiconductor bar showing fabrication of trenches in accordance with the invention.

In accordance with a feature of the invention, before the electrically isolating layer is provided, spaced trenches are etched in the bar 10 over the desired dividing lines 16, between the stripes 14. One way of doing this, which is not meant to be limiting, is to form by a standard photolithographic process a layer of resist 20 with slits 22 located, as shown in FIG. 2, where it is desired to etch the trenches, indicated by the numerals 16'. The trenches to be formed are shown in dashed lines and referenced 24. They extend across the entire bar 10. The trenches can be formed by any standard wet chemical etchant or dry etching process. Examples will be given below. The trenches preferably have the minimum width possible, typically about 10–50 μm, and also substantially vertical steep side walls so that the trench corners 26 are reasonably sharp. The depth of the trenches 24 should be at least about 0.2 μm and, preferably, should be deep enough to penetrate the deposited and epitaxial layers and penetrate into the substrate. For a typical laser structure, the depth would be of the order of 2–3 μm. Deeper trenches are acceptable, but would consume more time to etch. Shallower trenches may not create enough of a strain field so that the subsequent pressing operation will not concentrate the resultant stress at the trench corners.

Figure 3:
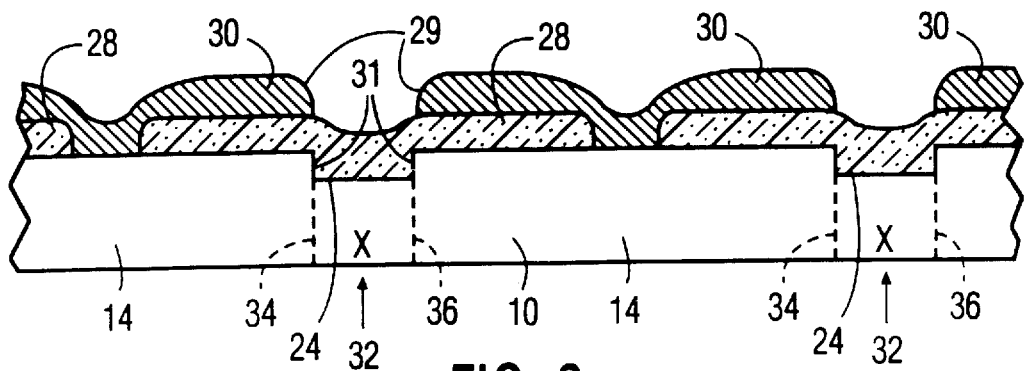
FIG. 3 is a cross-section through the semiconductor bar of FIG. 2 after further processing.

Following etching of the trenches, the electrically isolating layer 28 is deposited in the usual manner, patterned for the metallization, and then the metallization layer 30 deposited in the usual way, typically by vapor deposition. The result at this stage is shown in FIG. 3, with the electrically isolating layer 28 everywhere except over the active striped regions 14 where the metallization layer 30 contacts the crystal. Note that the metallization has been removed by a standard photolithographic process so that straight metallization edges 29 are formed approximately aligned with the trench sidewalls 31. Now, when pressure is applied 32 from the backside of the bar 10 at the lines represented by the Xs, the bar 10 will fracture along the lines 34 or 36, where the strain fields exist arising from the trench corners 26, representing abrupt or sharp changes in surface orientation, as well as from the metallization edges 29.

The metallization is typically of metals, such as platinum or gold for II–VI lasers, that have greatly different expansion coefficients than that of the semiconductor materials, so that strains are formed when the metallization cools down after deposition on the laser bar 10. The strain tends to concentrate at the metallization edges, which, aligned with the trench corners 26, increases the strain along the lines 34 and 36. Whether the fracture occurs at the line 34 or the line 36 is not important, since both locations are well separated from the active striped regions 14.

Figure 4:
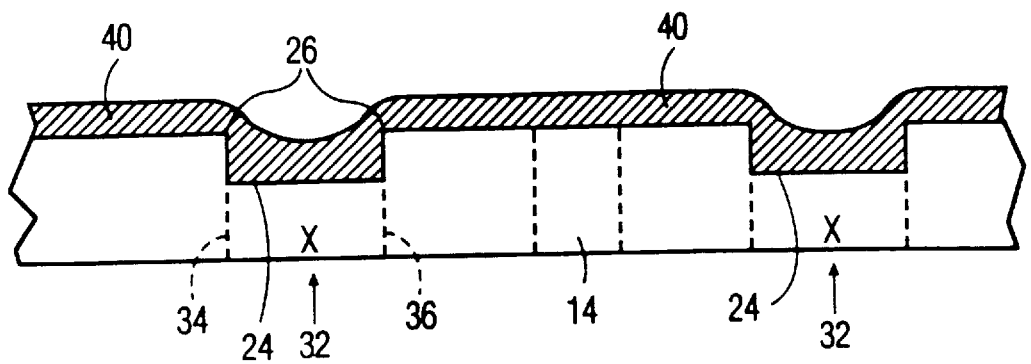
FIG. 4 is a cross-section through a semiconductor bar illustrating a modified process.

FIG. 4 illustrates a modified method in which only the trenches 24 are provided in the semiconductor bar 10. In this instance, the metallization 40 covers not only the crystal surfaces but also the recesses 24 formed by the etching. No metallization edges are present. Nevertheless, the trenches 24 alone create in the crystal sufficient strains concentrated at the trench corners 26 such that when pressure is applied, indicated by arrows 32, fracture will occur along lines 34 or 36.

Figure 5:
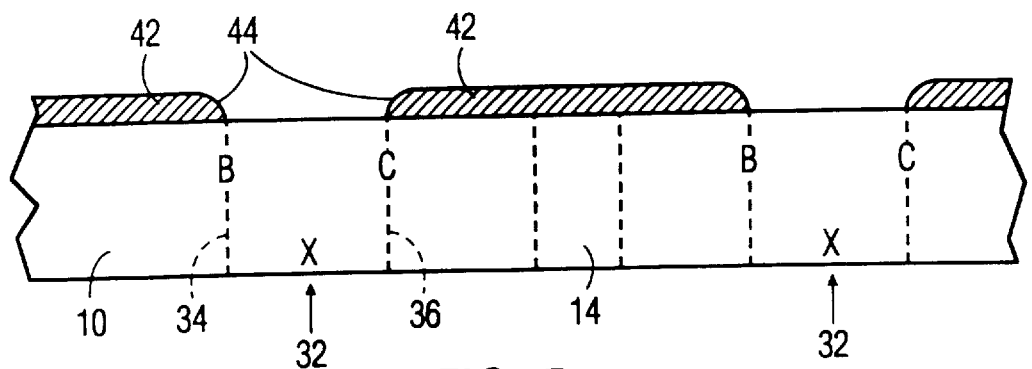
FIG. 5 is a cross-section through a semiconductor bar illustrating yet another modified process.

FIG. 5 illustrates still a further modification in which the patterned metallization 42 alone, without etched trenches, will at their edges 44 create sufficient local strain such that when pressure is applied indicated by arrows 32 the bar 10 will fracture along lines 34 or 36.

For the metallization alone to create the strain that will allow fracture, the layer should have a minimum thickness of at least 0.3 μm, which will depend upon the metal hardness. Hard metals like Pt can be thinner to produce at their edges a sufficiently strong strain field in the semiconductor crystal, whereas softer metals such as Au will have to be thicker to produce a corresponding strain field.

In all three embodiments, the trench sidewalls and metallization edges should extend in straight lines, parallel to a major crystal plane along which cleavage will occur. This is not a problem, as the cleavage step that forms the cavity mirrors is along a crystalline plane, and the separation into individual chips takes place along a direction perpendicular to the mirror surfaces, which will always represent a crystal plane.

The principal advantage of the invention is to allow chips to be separated by fracture along straight edges from a semiconductor wafer or bar by simply pressing on the back side of the crystal but without the need to mechanically remove material from the semiconductor crystal as by scribing to locate the fracture plane. The method works most satisfactorily by using the combination of the trenches and the metallization edges substantially aligned with the side walls of the trenches. It also works reasonably well with the trenches or the metallization edges alone but is not as reliable. However, there may be applications where it is inconvenient to make trenches or provide metallization edges where fracture is desired; hence, the ability to fracture with just one of these structures will prove useful.

While it is preferred that the pressure is applied to the back side of the wafer when fracturing the wafer, that is, to the surface opposite to the surface containing the trench or metallization edge, it is also possible to apply the pressure to the same surface where the trench or metallization edge is present.

Suitable wet chemical etchants for the laser bar described to form the trenches are:

1. For etching of a ZnTe cap layer, 1 vol. part of $H_2O$ (250 ml), $HNO_3$ (25 ml), $K_2Cr_2O_7$ (5 gr) to 4 vol. parts of water.

2. For etching of a graded ZnTe-ZnSe layer and ZnSe layer, including a ZnMgSeS quarternary layer, a 5-component solution of ethlene glycol (50 ml), methanol (25 ml) or any alcohol, HCl (25 ml), $H_2O$ (25 ml), and $Br_2$ (0.25 gr).

3. Etchant #2 can be followed by $H_2SO_4$:$H_3PO_4$ (1:1) for about 1 min. in an ultrasonic bath to remove any Se that may have been left over from the #2 etchant.

4. Also for the quarternary layer, conc. HCl or HBr.

5. For the GaAS, an $NH_4OH/H_2O_2/H_2O$ solution can be used.

Other known etchants can be substituted as will be appreciated by those skilled in this art. In general, etchants are preferred that form steep gradients and do not round off the material etched.

The invention is not limited to wet chemical etching. Dry etching, known also as ion milling or plasma etching, alone or together with wet chemical etching can be substituted. Such techniques are well known from the scientific and patent literature and need not be further described here.

While the invention has been described in connection with preferred embodiments, it will be understood that modifications thereof within the principles outlined above will be evident to those skilled in the art and thus the invention is not limited to the preferred embodiments but is intended to encompass such modifications.

What is claimed is:

1. A method for separating a semiconductor device on a chip from a larger semiconductor crystal wafer or bar on which said device has been fabricated, comprising the steps of:

(a) forming at a given location on a first major surface of the semiconductor wafer or bar a metallization layer having a straight edge in a desired plane of separation, said metallization layer creating a strain field in the semiconductor crystal in said plane of separation; and (b) thereafter applying pressure to the semiconductor wafer or bar at said first major surface, or at a second surface opposite to said major surface, to cause the wafer or bar to fracture at the given location along a straight line in said plane of separation without formation of a trench in said plane of separation.

2. The method of claim 1, wherein the metallization layer extends across the entire wafer or bar.

3. The method of claim 1, wherein the metallization layer is of Pt.

4. The method of claim 1, wherein the metallization layer is at least 0.3 $\mu$m thick.

5. A method for separating a semiconductor device on a chip from a larger semiconductor crystal wafer or bar on which said device has been formed, the wafer or bar being of a selected composition, the chip being separated therefrom by applying cleaving force to the wafer or bar in a cleavage plane disposed at a predetermined location relative thereto, the method comprising the steps of:

(a) selecting a metal composition in accordance with a strain field characteristic thereof;

(b) forming a metallization layer on a major surface of the wafer or bar using the selected metal composition, the metallization layer having an edge in said cleavage plane so as to create a strain field in the wafer or bar in said cleavage plane; and (c) applying cleaving force to the wafer or bar in said cleavage plane so as to separate the chip therefrom without formation of a trench in said cleavage plane.

6. The method of claim 5, wherein the metallization layer thickness is selected in relation to the metal composition and the semiconductor crystal composition, so that the strain field created in the semiconductor crystal will be sufficient for separation of the chip therefrom.

* * * * *